United States Patent
Mizuno

(10) Patent No.: US 8,244,449 B2
(45) Date of Patent: Aug. 14, 2012

(54) APPARATUS FOR DETECTING THE STATE OF BATTERY

(75) Inventor: Satoru Mizuno, Okazaki (JP)

(73) Assignee: Denso Corporation, Kariya (JP)

( * ) Notice: Subject to any disclaimer, the term of this patent is extended or adjusted under 35 U.S.C. 154(b) by 263 days.

(21) Appl. No.: 12/715,695

(22) Filed: Mar. 2, 2010

(65) Prior Publication Data

US 2010/0224157 A1 Sep. 9, 2010

(30) Foreign Application Priority Data

Mar. 3, 2009 (JP) .................. 2009-049142
Jan. 22, 2010 (JP) .................. 2010-012292

(51) Int. Cl.
*F02N 11/00* (2006.01)
(52) U.S. Cl. .................. 701/113; 123/179.4
(58) Field of Classification Search .................. 701/113; 123/179.3, 179.4; 324/430; 73/114.58, 114.59
See application file for complete search history.

(56) References Cited

U.S. PATENT DOCUMENTS

| 7,733,063 B2 * | 6/2010 | Mizuno et al. ............ 320/136 |
| 2007/0200567 A1 | 8/2007 | Mizuno et al. | |

FOREIGN PATENT DOCUMENTS

| JP | A-9-129267 | 5/1997 |
| JP | A-2002-168929 | 6/2002 |
| JP | A-2005-274214 | 10/2005 |
| JP | A-2007-223530 | 9/2007 |
| JP | 2010-36718 | * 2/2010 |

OTHER PUBLICATIONS

Japanese Office Action issued in Japanese Application No. 2010-012292 on Mar. 8, 2011 (with translation).

* cited by examiner

*Primary Examiner* — Hai Huynh
(74) *Attorney, Agent, or Firm* — Oliff & Berridge, PLC

(57) ABSTRACT

In an apparatus for detecting a state of a battery serving as a power source for cranking an internal combustion engine, a detecting unit and an internal resistance calculating unit are installed. The detecting unit detects a current and a voltage of the battery during a cranking period of the internal combustion engine, and outputs a parameter associated with at least one of the detected current and voltage of the battery. When a degree of change in the parameter within a specified period included in the cranking period is equal to or greater than a predetermined threshold, the internal resistance calculating unit calculates an internal resistance of the battery based on values of the current and voltage of the battery, the values of the current and the voltage being detected within the specified period.

12 Claims, 7 Drawing Sheets

APPARATUS FOR DETECTING THE STATE OF BATTERY

CROSS REFERENCE TO RELATED APPLICATIONS

This application is based on Japanese Patent Applications 2009-049142 and 2010-012292 filed on Mar. 3, 2009 and Jan. 22, 2010, respectively. This application claims the benefit of priority from the Japanese Patent Applications, so that the descriptions of which are all incorporated herein by reference.

FIELD OF THE INVENTION

The present invention relates to apparatuses for detecting the state of a battery used as a power source for cranking an internal combustion engine.

BACKGROUND OF THE INVENTION

Batteries to be used as power supplies for cranking internal combustion engines serve as power supply means for another device, such as control units. The voltage of such a battery is preferably maintained to be equal to or higher than a preset lower limit voltage in order to ensure the reliability of each control unit operating thereon and/or to prevent the battery from being deteriorated due to over discharge.

Thus, for maintaining the battery voltage at the preset lower limit voltage, it is necessary to detect, at a high accuracy, the state of a battery to be used as a power supply for restarting an internal combustion engine. This detection of the battery status contributes to safety control and stable operation for the battery.

From this viewpoint, for example, Japanese Patent Application Publication No. 2005-274214 discloses a first apparatus for calculating the internal resistance of a battery according to the amount of change in a discharge current from the battery and that of change in the voltage thereacross during the internal combustion engine being cranked; this internal resistance is used to estimate the remaining charge stored in the battery.

In addition, US Patent Application Publication No. 2007/0200567 corresponding to Japanese Patent Application Publication No. 2007-223530 discloses a second apparatus for calculating the internal resistance of a battery using linear regression calculated based on a group of pairs of sampled current and voltage values of the battery during the internal combustion engine being cranked; this internal resistance is used to estimate the voltage drop across the battery.

SUMMARY OF THE INVENTION

In the first system, the amount of change in the discharge current from the battery and that of change in the voltage thereacross during the is internal combustion engine being cranked are obtained based on a group of pairs of sampled current and voltage values of the battery during the internal combustion engine being cranked. Because the amount of change in the discharge current from the battery is large during the internal combustion engine being cranked, the internal resistance of the battery can be obtained at a high accuracy.

However, during the internal combustion engine being cranked, the polarized state of the battery varies. That is, the group of pairs of sampled current and voltage values of the battery during the internal combustion engine being cranked includes some pairs of current and voltage values of the battery that may be adversely affected by the variation in the polarized state of the battery. For this reason, in the first system, the calculated internal resistance of the battery may have an error. This may reduce the accuracy of the internal resistance of the battery.

In view of the circumstances set force above, the present invention seeks to provide apparatuses for detecting a state of a battery used as a power source for cranking an internal combustion engine; these systems are designed to solve such a problem set forth above.

Specifically, the present invention aims at providing apparatuses for detecting a state of a battery used as a power source for cranking an internal combustion engine; these apparatuses are designed to detect the state of the battery with high accuracy.

According to one aspect of the present invention, there is provided an apparatus for detecting a state of a battery serving as a power source for cranking an internal combustion engine. The apparatus includes a detecting unit configured to detect a current and a voltage of the battery during a cranking period of the internal combustion engine, and output a parameter associated with at least one of the detected current and voltage of the battery. The apparatus includes an internal resistance calculating unit configured to, when a degree of change in the parameter within a specified period included in the cranking period is equal to or greater than a predetermined threshold, calculate an internal resistance of the battery based on values of the current and voltage of the battery, the values of the current and the voltage being detected within the specified period.

In the one aspect of the present invention, the cranking period represents a period, during the start-up of the internal combustion engine, from when the internal combustion engine starts to be rotated to when a rotational speed of the internal combustion engine reaches a preset idle speed.

According to the one aspect of the present invention, the current and voltage of the battery are detected by the detecting unit during the cranking period of the internal combustion engine. The parameter associated with at least one of the detected current and voltage of the battery is outputted from the detecting unit.

As long as the degree of change in the outputted parameter within the specified period included in the cranking period is equal to or greater than the predetermined threshold, the internal resistance of the battery is calculated by the internal resistance calculating unit based on the values of the current and voltage detected within the specified period.

That is, when the degree of change in the outputted parameter within the specified period included in the cranking period is less than the predetermined threshold, the one aspect of the present invention eliminates, for calculating the internal resistance of the battery, values of the current and voltage detected within the specified period.

Because the values of the current and voltage detected within the specified period when the degree of change in the outputted parameter within the specified period included in the cranking period is less than the predetermined threshold, the values may cause an error in calculated the internal resistance. Thus, in comparison to conventional apparatuses for detecting the state of a battery, it is possible to calculate, with high accuracy, the internal resistance of the battery having a little of error.

According to another aspect of the present invention, there is provided an idling reduction control system installed in a motor vehicle. The motor vehicle includes an internal combustion engine and a starter for cranking the internal combustion engine. The idling reduction control system includes an engine stop unit configured to automatically stop the internal combustion engine when at least one engine automatic stop condition is met, a battery serving as a power source for cranking the internal combustion engine, and an apparatus for detecting a state of the battery. The apparatus includes a detecting unit configured to detect a current and a voltage of the battery during a cranking period of the internal combustion engine, and output a parameter associated with at least one of the detected current and voltage of the battery. The apparatus includes an internal resistance calculating unit configured to, when a degree of change in the parameter within a specified period included in the cranking period is equal to or greater than a predetermined threshold, calculate an internal resistance of the battery based on values of the current and voltage of the battery, the values of the current and the voltage being detected within the specified period. The apparatus includes a starting current calculator configured to calculate a starting current used to crank the internal combustion engine that has been stopped by the engine stop unit according to an amount of change in the voltage of the battery in the cranking period and the internal resistance. The apparatus includes a voltage drop estimator configured to estimate, based on the starting current and the internal resistance, a voltage drop across the battery due to the cranking of the internal combustion engine. The apparatus includes a determiner configured to determine, based on an actual value of the voltage of the battery and the estimated voltage drop, whether to maintain the internal combustion engine to be stopped. The apparatus includes an engine restarting unit configured to, when it is determined not to maintain the internal combustion engine to be stopped, supply the starting current to the starter so that the starter cranks the internal combustion engine.

According to another aspect of the present invention, because the internal resistance of the battery is calculated with high accuracy, the starting current and the voltage drop are calculated with high accuracy. Thus, in the idling reduction control routine carried out by the idling reduction control system, a determination of whether to maintain, based on an actual value of the voltage of the battery and the estimated voltage drop, the internal combustion engine to be stopped is more precisely carried out.

Accordingly, it is possible to more precisely carry out the idling reduction control routine, thus improving fuel economy of the motor vehicle.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Figure 1:
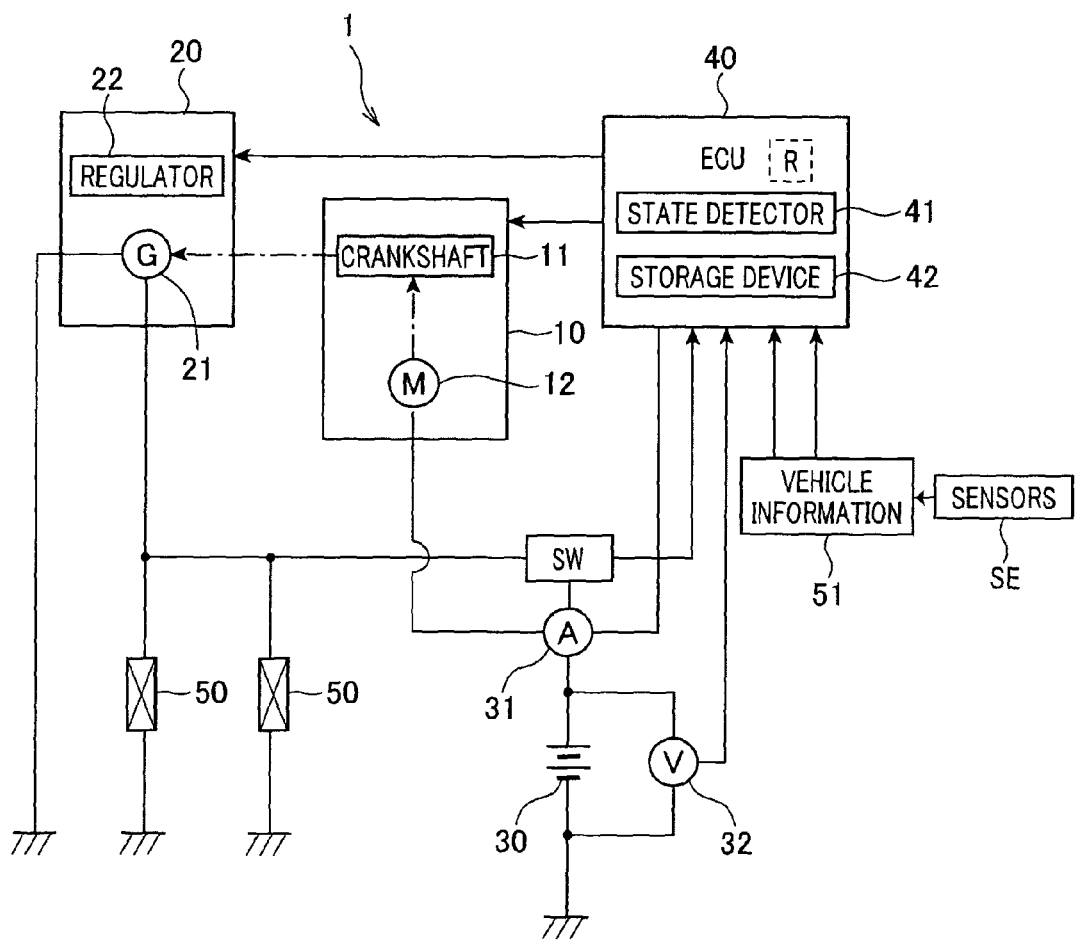
FIG. 1 is a block diagram schematically illustrating an example of the power supply system of an internal combustion engine control system according to an embodiment of the present invention.

An embodiment of the present invention will be described hereinafter with reference to the accompanying drawings. In the drawings, identical reference characters are utilized to identify identical corresponding components.

Referring to FIG. 1, an internal combustion engine control system, referred to simply as "engine control system"; 1 is installed in a motor vehicle. The engine control system 1 is equipped with an internal combustion engine, referred to simply as "engine", 10, a power generating apparatus 20, a battery 30, a current sensor 31, a voltage sensor 32, and an ECU (Electronic Control Unit) 40. The ECU 40 is electrically connected to the engine 10, the power generating apparatus 20, the current sensor 31, and the voltage sensor 32.

The engine 10 has a crankshaft 11 as its output shaft, and the crankshaft 11 is coupled, via a power train, to driving axels, both ends of which driving wheels are mounted. The engine 10 is operative to compress air-fuel mixture or air by a moving piston within each cylinder, and burn the compressed air-fuel mixture or the mixture of the compressed air and fuel within each cylinder to change the fuel energy to mechanical energy, such as rotative energy, thus rotating the crankshaft 11. The rotation of the crankshaft 11 is transferred to driving wheels through the powertrain and driving axles to thereby drive the vehicle.

In addition, the engine 10 includes a starter 12 consisting of an electrical motor. When the engine 10 is at rest, the engine 10 cannot move, by itself, the piston so that it cannot rotate, by itself. Thus, in order to start the engine 10, when energized by the battery 30, the starter 12 creates a torque that causes the crankshaft 11 to begin to turn to thereby start the engine 10 and so start the motor vehicle.

The power generating apparatus 20 consists of an alternator 21 and a regulator 22. The alternator 21 is made up of a stator with a stator winding, a rotor rotatable relative to the stator and coupled to the crankshaft 11, and a rectifier. The alternator converts rotary energy applied from the crankshaft 11 via the rotor into electrical energy. The electrical energy is obtained as an AC voltage induced in the stator winding.

The induced AC voltage is rectified by the rectifier to a DC voltage, and the DC voltage is outputted from an output terminal of the alternator.

The regulator 22 is operative to control the output voltage of the alternator 21 based on control signals sent from the ECU 40, to thereby regulate the output voltage to a desired target voltage. Specifically, the regulator 22 is operative to prevent the output voltage from exceeding the target voltage; this voltage excess is due to an increase in the rotational speed of the engine 10 and/or a reduction in power requirements of electrical loads 50 installed in the vehicle.

The battery 30 is for example a lead acid battery, but can be selected from a nickel hydride battery, and other storage batteries. The battery 30 has a positive terminal electrically connected to the output terminal of the alternator 21, and a negative terminal grounded. The output terminal of the battery 30 is also electrically connected to the starter 12 and the electrical loads 50 in parallel to the power generating apparatus 20.

The current sensor 31 is operative to detect an instantaneous value of charging current being supplied to the battery 30 or an instantaneous value of discharging current being supplied from the battery 30. The current sensor 31 is also operative to output, to the ECU 40, a signal indicative of the charging current or a signal indicative of the discharging current. The voltage sensor 32 is operative to detect the voltage (battery voltage) across the battery 32, and to output, to the ECU 40, a signal indicative of the battery voltage.

A driver-operable ignition switch SW is electrically connected between the battery 30 and each of the ECU 40, the power generating apparatus 20, and the electrical loads 50. When the ignition switch SW is turned on, power is supplied to each of the ECU 40, the power generating apparatus 20, and the electrical loads 50 from the battery 30.

Specifically, the ECU 40 grasps the state of charge in the battery 30 based on the charging current, the discharging current, and the battery voltage. According to the state of charge in the battery 30, the ECU 40 controls the output voltage of the alternator 21 to be greater than the battery voltage to thereby bring the battery 30 to a charged condition from the alternator 21, or controls the output voltage of the alternator 21 to be less than the battery voltage to thereby bring the battery 30 to a discharged condition to the electrical loads 50.

For example, the ECU 40 is designed as, for example, a normal microcomputer circuit consisting of, for example, a CPU, a storage medium including a non-volatile ROM (for example, EEPROM), a non-volatile RAM (for example, a backup RAM), or the like, an IO (Input and output) interface, and another peripheral device.

The ECU 40 functionally includes a state detector 41. The state detector corresponds to a state detecting apparatus according to the embodiment.

For example, the state detector 41 can be implemented as a program routine in the ECU 40. The ECU 40 also includes a non-volatile storage device 42 that retains (holds) information stored therein independently of whether power supply is switched off according to the state of the ignition switch SW for energizing the engine control system 1. The non-volatile storage device 42 can be implemented by, for example, the non-volatile ROM or the non-volatile RAM.

The state detector 41 is operative to calculate the internal resistance of the battery 30 based on current and voltage values respectively detected by the current sensor 31 and the voltage sensor 32 within a cranking period.

Note that the cranking period represents a period, during the start-up of the engine 10, from when the crankshaft 11 starts to be rotated by the starter 12 to when the rotational speed of the engine 10 reaches a preset idle speed (RPM).

The state detector 41 is also operative to calculate a value of the internal resistance of the battery 30 according to the current and voltage values detected by the respective sensors 31 and 32 during the cranking period. The state detector 41 is further operative to store, in the storage device 42, the detected current and voltage values and the calculated value of the internal resistance of the battery 30. The storage device 42 stores, therein, various items of data, such as threshold values to be used for the state detector 41 to execute calculations and determinations for detecting the state of the battery 30.

The ECU 40 is configured to electronically control the engine 10 and the power generating apparatus 20. For example, the ECU 40 is configured to output, according to the state of the battery 30 detected by the state detector 41 and/or the temperature of the battery 30 included in vehicle information 51, the control signals indicative of the target voltage to be regulated.

The vehicle information 51 can be continuously or periodically measured by various sensors SE to be inputted to the ECU 40. For example, the vehicle information 51 includes, in addition to information associated with the battery 30, the operating conditions of the engine 10, information indicative of the vehicle speed, and information indicative of an operated condition of an accelerator pedal of the motor vehicle and an operated condition of a brake pedal of the motor vehicle.

The ECU 40 is programmed to determine whether to carry out an idling reduction control routine R based on the vehicle information 51.

For example, when determining, based on the vehicle information 51, that the driver operates the accelerator pedal to fully close the throttle valve or operates the brake pedal during the vehicle running so that the vehicle is in a preset deceleration state in which the vehicle is likely to be stopped, the ECU 40 determines that an engine automatic stop request occurs, in other words, at least one of the engine automatic stop conditions is met.

Then, the ECU 40 carries out an engine automatic stop routine included in the idling reduction routine R. Specifically, when the vehicle is stopped so that the engine 10 is shifted to be in idle, the ECU 40 shuts off the fuel injection to each cylinder of the engine 10 to stop the burning of the air-fuel mixture in each cylinder. The stop of the burning of the air-fuel mixture in each cylinder of the engine 10 means the automatic stop of the engine 10.

Thereafter, during the rotational speed of the engine 10 automatically dropping or after the rotational speed of the engine 10 reaching zero, when at least one of predetermined engine restart conditions is met, the ECU 40 carries out an engine automatic restart routine included in the idling reduction routine R.

For example, when determining that the accelerator pedal is depressed or the brake pedal is released, the ECU 40 determines that the at least one of the predetermined engine restart conditions is met.

Then, the ECU 40 carries out an engine automatic restart routine included in the idling reduction routine R. Specifically, the ECU 40 sends, to the starter 12, an engine restart instruction (engine start instruction) so that the starter 12 causes the crankshaft 11 to begin to turn to thereby crank the engine 10. In addition, in the engine automatic restart routine, the ECU 40 starts the burning of the air-fuel mixture in each cylinder to thereby start the engine 10.

Idling Reduction Control

Figure 2:
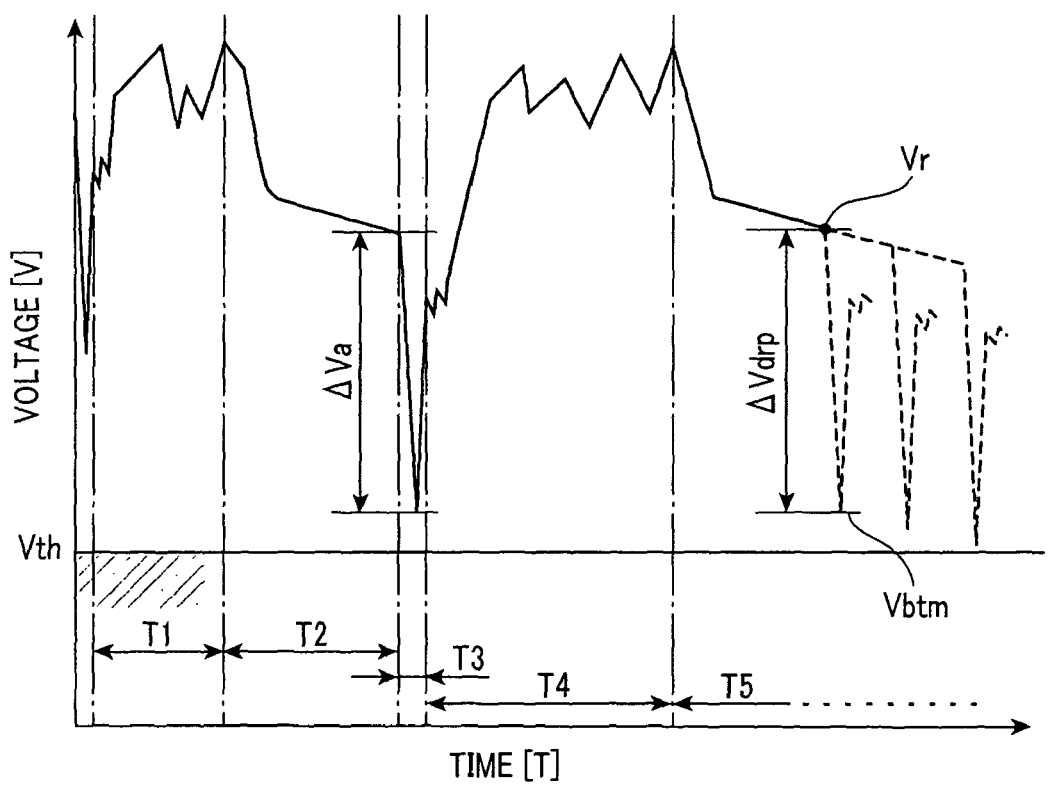
FIG. 2 is a graph schematically illustrating the variation in a voltage across a battery relative to the variation in operating conditions of an internal combustion engine illustrated in FIG. 1.

Next, determination of whether the engine 10 is continuously stopped based on the idling reduction routine R will be described hereinafter with reference to FIG. 2. FIG. 2 schematically illustrates the variation in the voltage across the battery 30 relative to the variation in the operating conditions of the engine 10.

First, for a period T1 during which the motor vehicle is running, the battery 30 is controlled by the ECU 40 so that the battery voltage is maintained within a preset voltage range. Next, when the motor vehicle is stopped, the ECU 40 carries out the determination of whether to carry out the idling reduction control routine R based on the vehicle information 51.

When it is determined to carry out the idling reduction control routine R, the ECU 40 carries out the engine automatic stop routine included in the idling reduction control routine R. This execution of the engine automatic stop routine automatically stops the engine 10 so that the power generating apparatus 20 is in stop condition. Thus, within a period from when the engine 10 starts to be automatically stopped to when the restart of the engine 10 (restart the burning of the air-fuel mixture) begins, the battery 30 supplies enough power to the electrical loads 50 because no power is supplied from the power generating apparatus 20 thereto; this period corresponds to the sum of a period T2 and a period T3.

This power supply causes the voltage across the battery 30 to drop within the period T2 from the start of the automatic stop control of the engine 10 to the output of the engine restart instruction. The amount of drop in the battery voltage is determined according to the reduction in the amount of charge stored in the battery 30 (battery capacity) and the polarization therein within the period T2.

Thereafter, when determines that the at least one of the predetermined engine restart conditions is met, the ECU 40 carries out the engine automatic restart routine included in the idling reduction routine R to output the engine restart instruction to the starter 12, thus giving the preset idle speed to the crankshaft 11 of the engine 10 by the starter 12.

That is, after the elapse of the cranking period since the crankshaft 11 starts to be rotated, the burning of the air-fuel mixture is carried out in each cylinder of the engine 10 (see a period T4).

At that time, note that, for a very short period from the output of the engine restart instruction to the starter 12 to the start of rotation of the starter 12, a large amount of discharging current is supplied to the starter 12 from the battery 30 so that the voltage across the battery 30 sharply drops due to the large amount of discharging current.

Specifically, as illustrated in FIG. 2, the battery voltage drops by ΔVa within the period T3 from the output of the engine restart instruction to the restart of the engine 10; this period T3 contains the very short period. In other words, within the period T3, the battery voltage becomes a minimum voltage Vbtm when it changes by the maximum voltage drop ΔVa. Thereafter, the restart of the engine 10 causes the power generating apparatus 20 to restart to generate a regulated DC voltage outputted from the alternator 21. For a period T4 from the restart of the engine 10 to the stop of the engine 10 again, the battery 30 is controlled by the ECU 40 so that the battery voltage is maintained within the preset voltage range in the same manner as the period T1.

Note that the lower limit voltage Vth for the battery 30 is defined, as a minimum voltage to be supplied from the battery 30, to ensure the reliability of the operations of the ECU 40 and/or to prevent the battery 30 from being deteriorated due to over discharge. Thus, the idling reduction control routine R is preferably carried out such that the minimum voltage Vbtm is maintained to be equal to or higher than the lower limit voltage Vth.

For this reason, for example, for a period T5 during which the engine 10 is stopped, the ECU 40 continuously monitors the state of the battery 30, and calculates values of the minimum voltage Vbtm at different timings based on values of the battery voltage Vr at the different timings and estimated voltage drops thereat. Then, the ECU 40 determines whether to maintain the engine 10 to be stopped according to the calculated values of the minimum voltage Vbtm and the lower limit voltage Vth.

For example, when it is determined that a calculated value of the minimum voltage Vbtm reaches a preset threshold value set slightly greater than the lower limit voltage Vth, the ECU 40 carries out the engine automatic restart routine to restart the engine 10 even though the vehicle is stopped.

In addition, for the period T2, the determination of whether to maintain the engine 10 to be stopped according to the calculated values of the battery voltage Vr and the lower limit voltage Vth is carried out in the same manner as the period T5 set forth above.

It follows from what has been described that it is necessary to accurately detect the state of the battery 30 in order to properly carry out the idling reduction control routine R. In other words, it is necessary to more accurately estimate the voltage drop of the battery 30 to be used to calculate the minimum voltage Vbtm.

In order to address the requirement, the state detector according to the embodiment is configured to calculate the internal resistance of the battery 30 to be used to estimate the voltage drop of the battery 30 to thereby more accurately estimate the voltage drop of the battery 30.

Detection of State of Battery 30

Next, how to detect the state of the battery 30 by the state detector 41 will be described hereinafter with reference to FIGS. 3 to 8.

Figure 3:
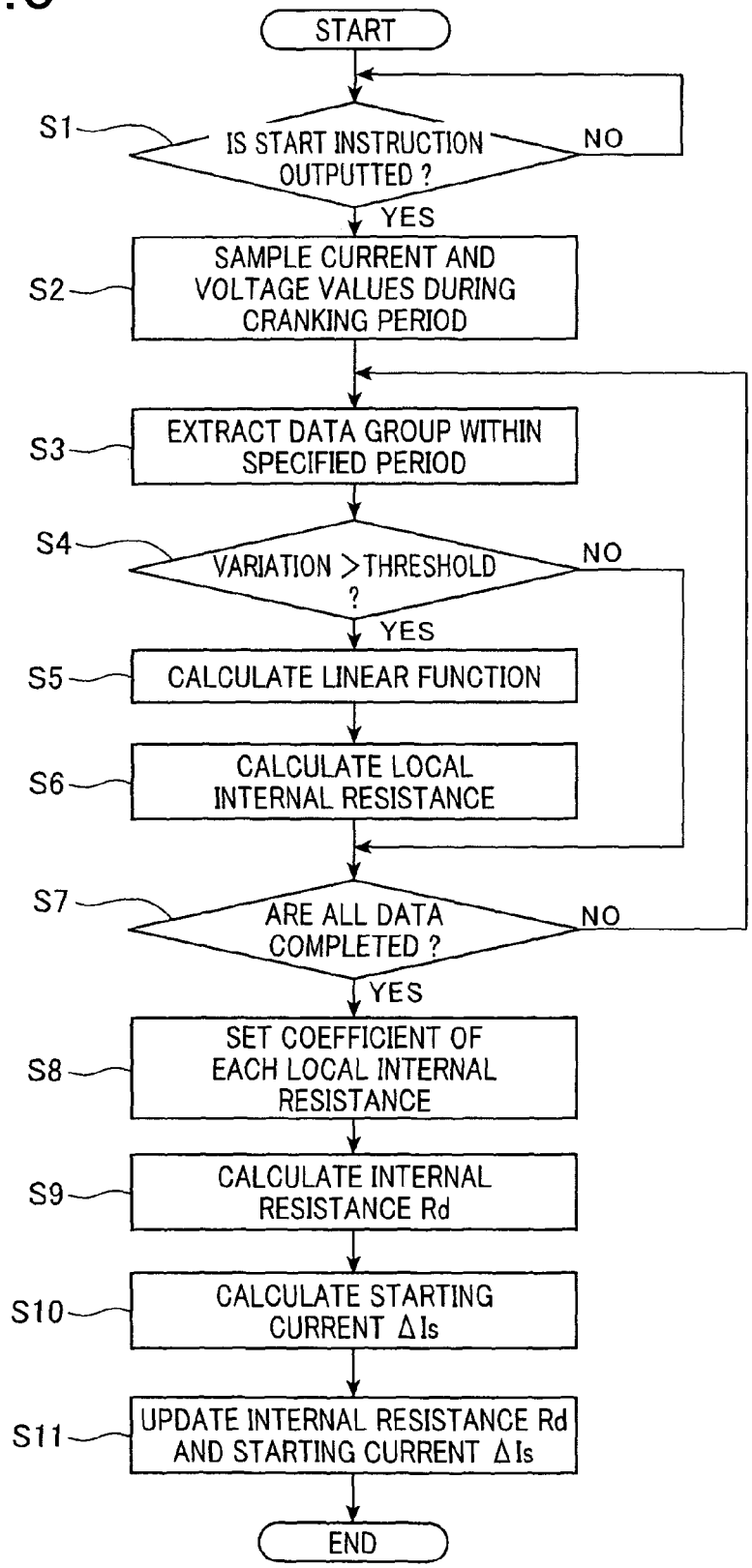
FIG. 3 is a flowchart schematically illustrating a battery-state detecting routine to be executed by an ECU illustrated in FIG. 1 according to the embodiment.
Figure 4:
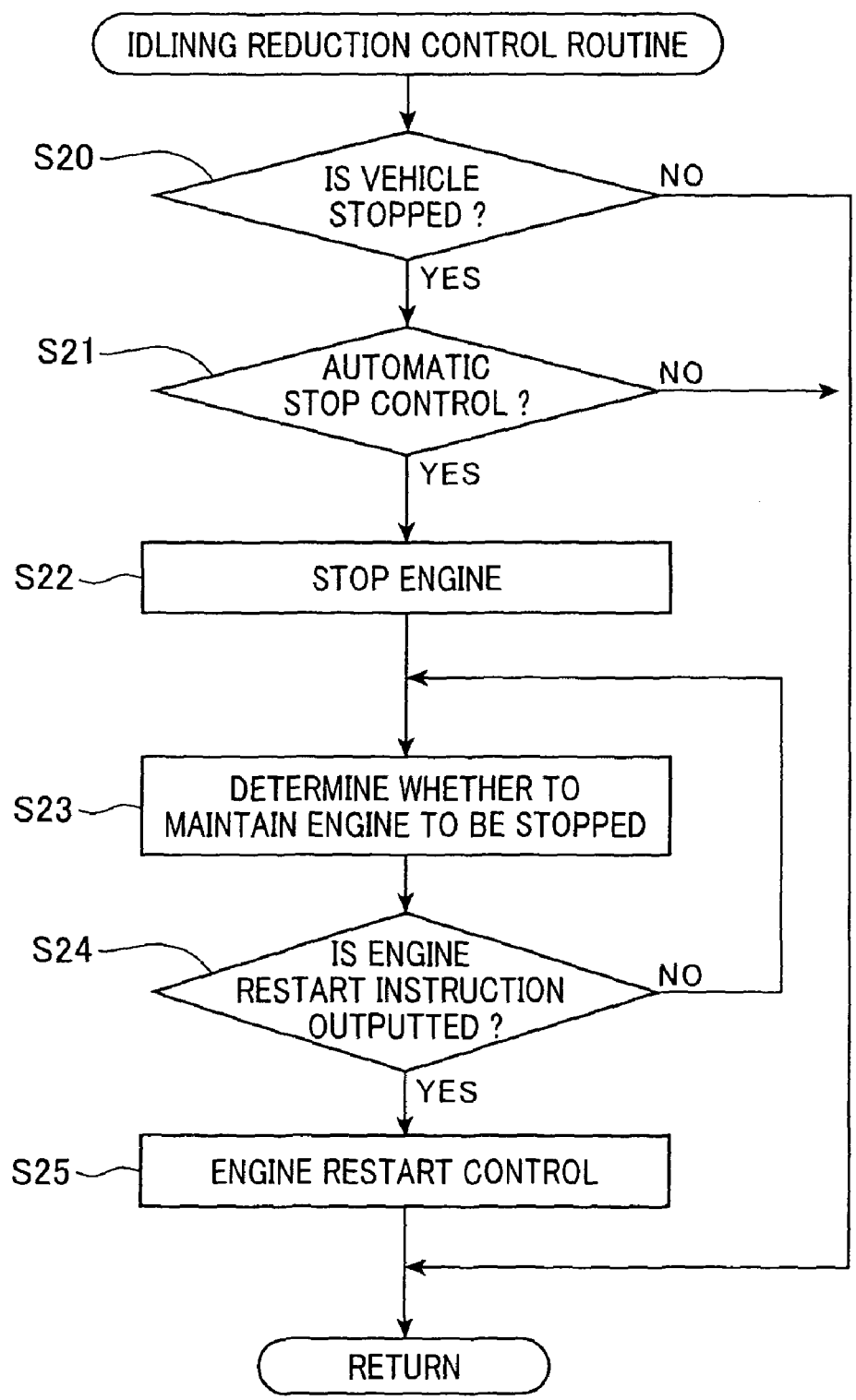
FIG. 4 is a flowchart schematically illustrating an idling reduction control routine to be executed by the ECU according to the embodiment.

FIG. 3 is a flowchart schematically illustrating a battery-state detecting routine to be executed by the ECU 40 according to the embodiment, and FIG. 4 is a flowchart schematically illustrating the idling reduction control routine R to be executed by the ECU 40 according to the embodiment.

Figure 5:
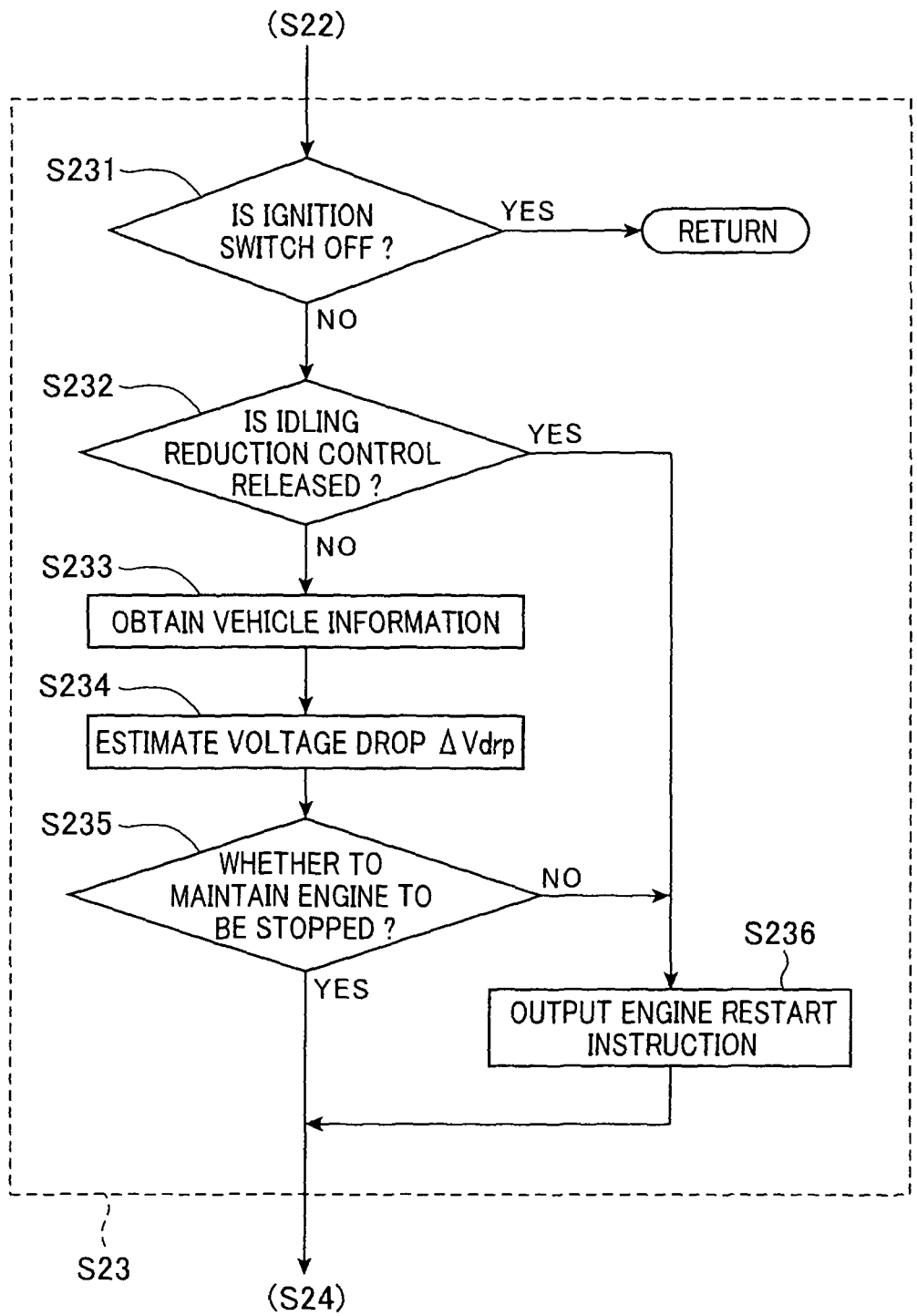
FIG. 5 is a flowchart schematically illustrating a routine, to be executed by the ECU, for determining whether to maintain the internal combustion engine to be stopped according to the embodiment.
Figure 6:
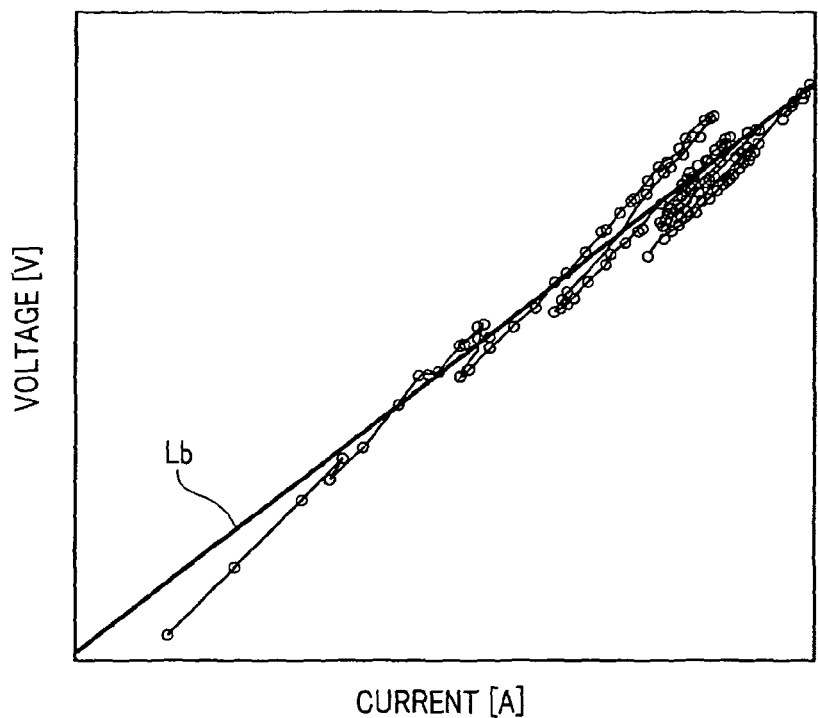
FIG. 6 is a graph schematically illustrating current-voltage characteristics of the battery at the start-up of the engine according to the embodiment.

FIG. 5 is a flowchart schematically illustrating a routine for determining whether to maintain the engine 10 to be stopped according to the embodiment, and FIG. 6 is a graph schematically illustrating current-voltage characteristics of the battery 30 at the start-up of the engine 10 according to the embodiment.

Figure 7:
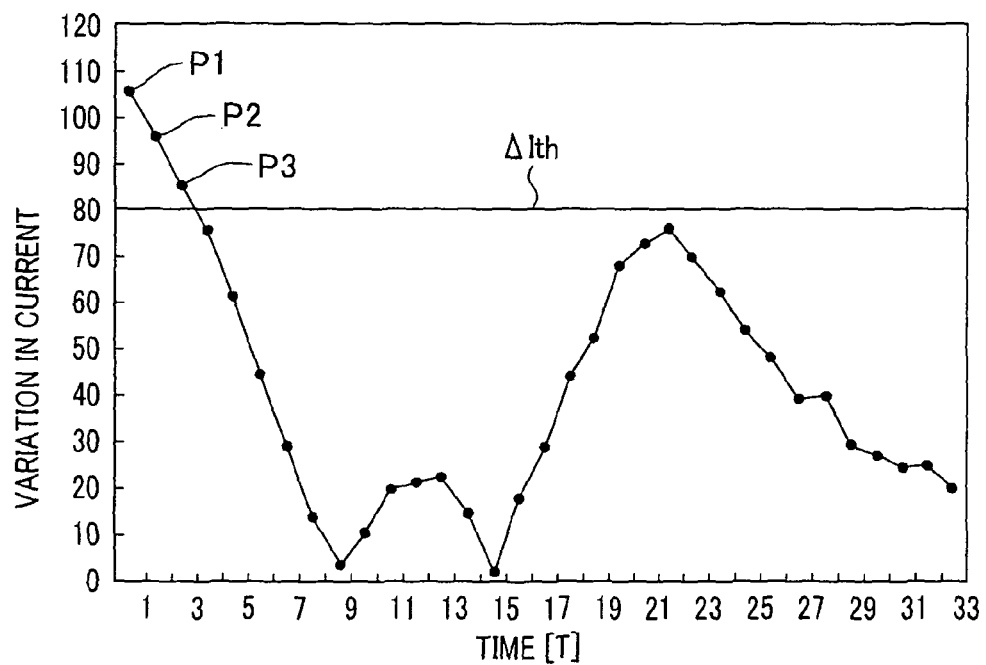
FIG. 7 is a graph schematically illustrating the variation in the amount of change in current of the battery according to the embodiment.
Figure 8:
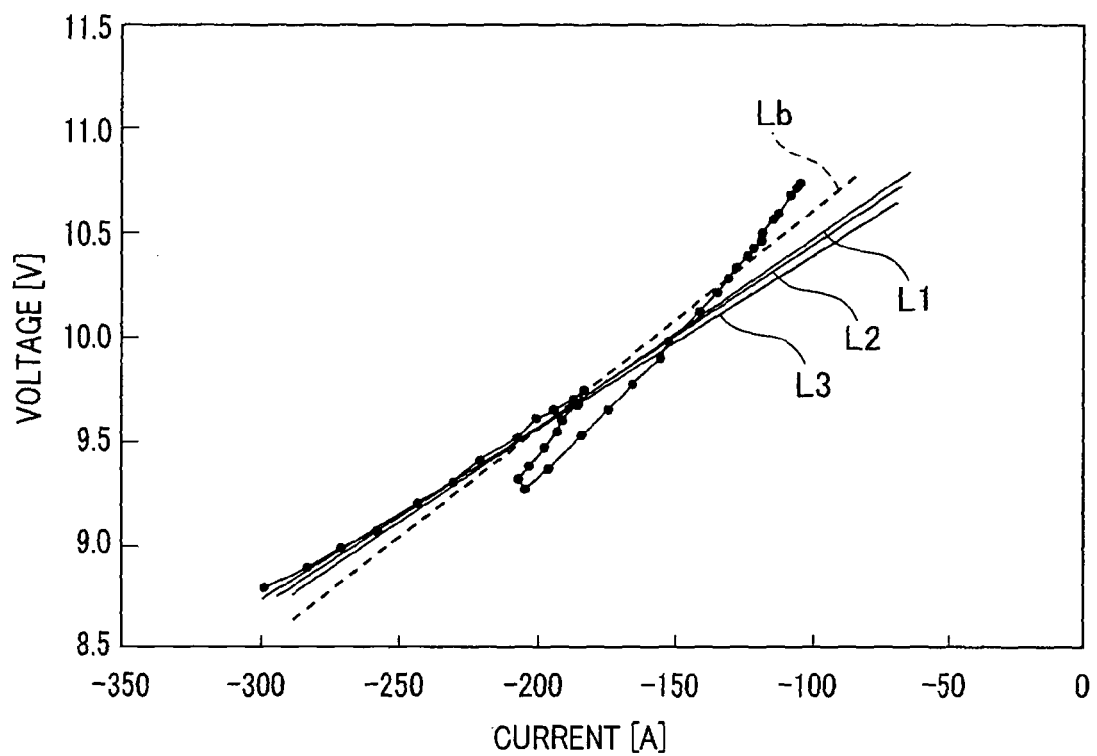
FIG. 8 is an enlarged view of part of FIG. 6.

FIG. 7 is a graph schematically illustrating the variation in the change in current (charging current or discharging current) of the battery 30 according to the embodiment, and FIG. 8 is an enlarged view of part of FIG. 6.

For example, the state detector 41 runs the battery-state detecting routine illustrated in FIG. 3 each time the ignition switch SW is turned on.

In step S1, the state detector 41 determines whether the engine start instruction or the engine restart instruction is outputted from the ECU 40. When it is determined that the engine start instruction or the engine restart instruction is not outputted from the ECU 40 (NO in step S1), the state detector 41 repeatedly carries out the determination in step S1.

Otherwise, when it is determined that the engine start instruction or the engine restart instruction is outputted from the ECU 40 (YES in step S1), the state detector 41 determines that the start of the engine 10 begins. Thus, the state detector 41 terminates the loop operation in step S1 and proceeds to step S2. Note that, in step S1, the state detector 41 can determine that the start of the engine 10 begins when the discharging current from the battery 30 to the starter 12 appears.

The state detector 41 starts to detect current values of the battery 30 and corresponding voltage values of the battery 30 according to the signals outputted from the current and voltage sensors 31 and 32 in step S2. Specifically in step S2, the state detector 41 samples, at each sampling period, a value of the current of the battery 30 and a corresponding value of the voltage of the battery 30, and stores the value of the current of the battery 30 and the corresponding value of the voltage of the battery 30 at each sampling period.

The current-voltage characteristics between the sampled values of the current of the battery 30 and the sampled values of the battery voltage are illustrated in FIG. 6. Referring to FIG. 6, the current-voltage characteristics are represented as a scatter graph having a certain level of variance. Note that the state detector 41 can distinguish the cranking period during the start of the engine 10 based on the current values of the battery 30, the rotational speed of the engine 10, and the like.

The state detector 41 outputs at least one of: a value of the current of the battery 30; and a corresponding value of the battery voltage at each sampling period as a value of a parameter associated with at least one of the current and voltage of the battery 30. In the embodiment, the parameter is the current of the battery 30.

Next, the state detector 41 extracts some of the sampled values of the current of the battery 30 within a specified period contained in the cranking period and extracts some of the sampled values of the battery voltage within the specified period; these extracted values of the current of the battery 30 correspond to these extracted values of the battery voltage, respectively in step S3.

In the embodiment, the specified period is set to be, for example, 48 microseconds [ms], and the sampling period is set to be, for example, 4 [ma].

That is, twelve pairs of the sampled current and voltage values are extracted from the storage device 42. The specified period and the sampling period can be appropriately set to another value.

Next, the state detector 41 carries out an internal resistance calculation task described hereinafter.

Specifically, the state detector 41 extracts, from the twelve pairs of the sampled current and voltage values, the first sampled current value and the last sampled current value, and calculates the difference (absolute difference) between the first sampled current value and the last sampled current value in step S4. The calculated difference represents a variation in the sampled current values of the battery 30 within the specified period.

Then, in step S4, the state detector 41 compares the variation in the sampled current values of the battery 30 within the specified period with a predetermined threshold value stored in the storage device 42.

In the embodiment, as a variation in the sampled current values of the battery 30, the difference between the last sampled current value and the first sampled current value is used, but the maximum difference between each of the sampled current values or the minimum difference between each of the sampled current values can be used as a variation in the sampled current values of the battery 30.

In step S4, the threshold value to be compared with a variation in the sampled current values (sampled values of the parameter) is a previously determined constant value. The threshold value allows the adverse effects of the variation in the polarized state of the battery 30 within the specified period to be reduced.

That is, the threshold value is set such that: the ratio of polarization resistance components to the internal resistance Rd within the specified period is reduced; and the internal resistance Rd can be approximated to state-resistance components. Thus, the threshold value depresses the adverse effects of the polarization in calculating the internal resistance Rd.

Note that the internal resistance Rd consists of the polarization resistance components and the state-resistance components. The polarization resistance components vary with variation in the polarized state of the battery 30, and the state-resistance components vary with variation in the state of the battery 30 and consist of resistance components except for the polarization resistance components. The polarization resistance components are resistance components caused by the movement and diffusion of charges in polarization during discharge of the battery 30, and the state-resistance components are resistance components caused by the electrode plates and the active materials that change depending on the structure of the battery 30 and/or the deteriorated state thereof.

The polarized state of the battery 30 probably varies during the specified period included in the cranking period. When the polarized state of the battery 30 varies, the calculated internal resistance Rd of the battery 30 may have an error due to the effects of the varied polarization.

However, because the variation in the polarized state of the battery 30 per unit time is limited, the change in the polarization resistance components with variation in the polarized state of the battery 30 is limited. In addition, because, the greater a variation in the detection values is, the smaller the effects of the polarization of the battery 30 are, the internal resistance Rd during the specified period is close to the state-resistance components.

Thus, the threshold value is appropriately set in consideration of the change in the polarization resistance components estimated during the specified period so that the rate of the polarization resistance components to the internal resistance Rd is reduced and the internal resistance Rd can be approximated to the state-resistance components.

In step S4, when the variation in the sampled current values of the battery 30 is greater than the predetermined threshold value based on the result of the comparison (YES in step S4), the state detector 41 derives a linear approximation function from the sampled current and voltage values included within the specified period in step S5. That is, the state detector 41 calculates, from the sampled data group within the specified period, a linear regression using least-square approach.

In step S6, the state detector 41 obtains a local internal resistance value within the specified period from the inclination of the calculated linear regression.

Otherwise, in step S4, when the variation in the sampled current values of the battery 30 is equal to or lower than the predetermined threshold value based on the result of the comparison (NO in step S4), the state detector 41 terminates the calculation of the local internal resistance value within the specified period, proceeding to step S7. In addition, when completing the operation in step S6, the state detector 41 proceeds to step S7.

In step S7, the state detector 41 determines whether the operation of the local internal-resistance value calculating operation has been carried out based on all of the sampled current values and voltage values within the cranking period.

When it is determined that the calculation of the local internal resistance value has not been carried out based on all of the sampled current values and voltage values within the cranking period yet (NO in step S7), the state detector 41 sets, within the cranking period, a new specified period to be used as the next calculation of the local internal resistance value in step S7a. For example in step S7a, the state detector 41 sets the new specified period by shifting the actual specified period by the sampling period of 4 [ms] toward the last in the cranking period. Thereafter, the state detector 41 returns to step S3 and carries out the calculation of the local internal resistance value for the new specified period in the loop task of steps S3 to S7.

That is, the calculation of the local internal resistance value for the new specified period in the loop task of steps S3 to S7 are repeated while the new specified period is set within the cranking period until the determination in step S7 is YES, that is, the calculation of the local internal resistance value has been carried out based on all of the sampled current values and voltage values within the cranking period.

Therefore, when the calculation of the local internal resistance value has been carried out based on all of the sampled current values and voltage values within the cranking period (YES in step S7), the state detector 41 terminates the loop task of steps S3 to S7, proceeding to step S8.

As described above, for each of the plurality of specified periods included in the cranking period, the calculation of the local internal resistance value is carried out. At that time, there are some cases where the variation in the detected values of the parameter is greater than the threshold value. This results in that the local internal resistance values are calculated within the cranking period during the start-up of the engine 10.

Thus, in step S8, the state detector 41 sets a plurality of coefficients for the plurality of specified periods, respectively; these coefficients are arranged to be in ascending order from the start of the cranking period toward the last thereof.

Thereafter, in step S9, the state detector 41 multiplies the local internal resistance values by the corresponding coefficients, respectively, to thereby average the local internal resistance values; this averaging calculates the internal resistance Rd within the cranking period. Note that the sum of the coefficients is set to 1; this averages the local internal resistance values.

For example, it is assumed that:
a number n (n is an integer greater than 1) of the loop task (steps S3 to S7) are carried out based on the sampled current and voltage values within the cranking period so that a number n of local internal resistance values Rd1 to Rdn are calculated. The first local internal resistance value Rd1 is calculated based on the sampled current and voltage values within the first specified region in the cranking period, and the n-th local internal resistance value Rdn is calculated based on the sampled current and voltage values within the last specified region in the cranking period.

In this assumption, the state detector 41 sets n coefficients K1 to Kn for the local internal resistance values Rd1 to Rdn, respectively (see step S8). Thus, the internal resistance Rd of the battery 30 is calculated in accordance with the following equation [1] (see step S9):

$$Rd = K1 \times Rd1 + K2 \times Rd2 + \ldots + Kn \times Rdn \quad [1]$$

where the n coefficients K1 to Kn are set to meet the following equations:

$$K1 < K2 \ldots < KN$$

$$K1 + K2 + \ldots + Kn = 1$$

In other words, the n coefficients K1 to Kn are set to monotonically increase, and they are set so that the sum of all of the n coefficients K1 to Kn becomes 1.

As described above, in step S8, the state detector 41 sets the plurality of coefficients for the plurality of specified periods, respectively, and, in step S9, the state detector 41 calculates the internal, resistance Rd. In order to simply average the plurality of local internal resistance values, assuming that a number n of local internal resistance values Rd1 to Rdn are calculated as the plurality of local internal resistance values, each of the n number of coefficients K1 to Kn can be set to be 1/n. Otherwise, any one local internal resistance value can be selected from the plurality of local internal resistance values as the internal resistance Rd.

Next, the state detector 41 calculates a starting current ΔIs for the engine 10 based on the internal resistance Rd within the cranking period. Note that the starting current ΔIs represents the discharging current required to activate the starter 12 during the engine 10 at rest so as to cause the crankshaft 11 to turn at the preset idle speed in step S10.

Specifically, in step S10, the state detector 41 detects a value of the voltage across the battery 30 immediately before the activation of the starter 12. Next, the state detector 41 activates the starter 12, and extracts, from the detected values of the battery voltage during the start of the engine 10, the minimum value.

Then, in step S10, the state detector 41 calculates the difference between the value of the battery voltage immediately before the activation of the starter 12 and the minimum value of the battery voltage. Based on the calculated difference, the state detector 41 calculates a voltage drop across the battery 30 at the start of the engine 10.

In step S10, the state detector 41 divides the voltage drop by the internal resistance Rd calculated in step S9 to thereby calculate the starting current ΔIs. The state detector 41 stores the value of the internal resistance Rd and the value of the starting current ΔIs in the storage device 42 to update previously stored values of the internal resistance Rd and the starting current ΔIs in step S11, terminating the battery-state detecting routine.

Here, as descried in the BACKGROUND OF THE INVENTION, a conventional apparatus (state detector) calculates a linear regression Lb based on the scatter graph of the current-voltage characteristics illustrated in FIG. 6. Then, the conventional state detector obtains the inclination of the linear regression Lb, and calculates, based on the inclination, the internal resistance.

However, the conventional internal-resistance calculating method causes the following problem.

Specifically, within the cranking period during the start of the engine 10, the polarized state of the battery 30 continuously varies. In addition, the current and voltage to be applied to the starter 12 repetitively increase and decrease with variations in torque of the engine 10 and increase in the rotational speed of the engine 10. That is the scatter graph of the current-voltage characteristics illustrated in FIG. 6 has a certain level of variance due to: the change in the polarized state of the battery 30, and the repetitive increase and decrease of the current and voltage in addition to a certain level of variance due to detection error.

Thus, when the internal resistance of the battery 30 is calculated based on the linear regression Lb calculated from the scatter graph illustrated in FIG. 6, the calculated internal resistance of the battery 30 includes an error due to these variances.

In contrast, in the embodiment, the state detector 41 compares a variation in the sampled current values of the battery 30 within the specified period with the predetermined threshold value in step S4. In addition, the variation in the current values of the battery 30 is within the specified period contained in the cranking period (see FIG. 7).

Thus, when the variation in the sampled current values of the battery 30 at each of the specified periods P1, P2, and P3 is greater than the threshold value ΔIs, the state detector 41 calculates, from the sampled data group within each of the specified periods P1, P2, and P3, a linear regression using least-square approach for each of the specified periods P1, P2, and P3 (see steps S4 and S5). Thus, as illustrated in FIG. 8, the plurality of liner regressions L1, L2, and L3 corresponding to the specified periods P1, P2, and P3 are calculated.

According to the linear regressions L1, L2, and L3, the state detector 41 calculates a plurality of local internal resistance values, and calculates the internal resistance Rd based on the plurality of local internal resistance values in steps S8 and S9.

As described above, when a variation in the sampled current values of the battery 30 within a specified period is greater than the threshold value ΔIth, the rate of change in the current of the battery 30 within the specified period is equal to or higher than a preset threshold value. This can determine that the data group within the specified period is detected when the change in the polarized state of the battery 30 is small.

In addition, when the current of the battery 30 repetitively increase and decreases within a specified period, the change in the current of the battery 30 is small so that it does not exceed the threshold value ΔIth. That is, when the rate of change in the current of the battery 30 is equal to or higher than the preset threshold value, it is possible to estimate that the data group sampled within the specified period is detected while the current of the battery 30 does not increase and decrease (does not fluctuate) or it slightly fluctuates.

Thus, it is possible to calculate the internal resistance based on the data group within at least one specified period included in the cranking period; the data group within the at least one specified period has a small variance due to the change in the polarized state of the battery 30 and a small variance due to the fluctuate of the current and voltage of the battery 30.

The state detector 41 according to the embodiment therefore calculates the internal resistance Rd of the battery 30 at higher accuracy in comparison to conventional state detectors.

Note that the operations in steps S3 to S11 are carried out at a proper timing after the operation in step S2 during the start of the engine 10. For example, they can be carried out during the motor vehicle running (see the period T1 or T4 in FIG. 2)) or during execution of the idling reduction control routine R (see the period T2 or T5 in FIG. 2). In addition, in the embodiment, the operations in steps S3 to S11 during the present cranking period can be carried out based on the sampled current and voltage values during the previous cranking period.

In addition, the ECU 40 runs the idling reduction control routine R in a given cycle during its being energized.

In accordance with the idling reduction control routine R, the ECU 40 determines whether the motor vehicle is stopped in step S20. When the motor vehicle is running (NO in the determination step S20), the ECU 40 terminates the idling reduction control routine R.

On the other hand, when the vehicle is stopped (YES in the determination in step S20), the ECU 40 determines whether at least one of the engine automatic stop conditions is met in step S21).

When no engine automatic stop conditions are met (NO in step S21), the ECU 40 exits the idling reduction control routine R.

In contrast, when at least one of the engine automatic stop conditions is met (YES in step S21), the ECU 40, for example, controls the engine 10 so that the supply of fuel to each cylinder is shut off to thereby engine 10 is automatically stopped (the burning of the air-fuel mixture is stopped) in step S22.

Next, in step S23, the ECU 40 determines whether to maintain the engine 10 to be stopped. The operation in step S23 will be fully descried later, When it is determined not to maintain the engine 10 to be stopped, the ECU 40 outputs the engine restart instruction.

In step S24, the ECU 40 determines whether the engine restart instruction has been outputted therefrom. When the engine restart instruction has not been outputted (NO in step S24), the ECU 40 maintains the engine 10 to be stopped, and repeatedly carries out the determination in step S24.

In contrast, when the engine restart instruction has been outputted (YES in step S24), the ECU 40 carries out the engine automatic restart routine following the output of the engine restart request even if the engine 10 is stopped so as to restart the engine 10.

Next, the operation that determines whether to maintain the engine 10 to be stopped in step S23 will be described in detail hereinafter.

Referring to FIG. 5, the ECU 40 determines whether the ignition switch SW is turned off in step S231. In step S231, for example, the ECU 40 determines whether the vehicle is parked so that it is unnecessary to carry out the idling reduction control routine R.

When the ignition switch SW is turned off (YES in the determination in step S231), the ECU 40 terminates the operation in step S23 and the idling reduction control routine R.

Otherwise, when the ignition switch SW is turned on (NO in the determination in step S231), the ECU 40 determines whether the idling reduction control routine R is intentionally released by the driver in step S232. For example, in step S232, when, for example, a fully depressed brake pedal is released, the ECU 40 determines that the idling reduction control routine R is not released by the driver in step S232 (NO in step S232), the ECU 40 proceeds to step S233.

In step S233, the state detector 41 of the ECU 40 calculates at least three internal-resistance correcting variables based on the vehicle information 51.

Specifically, the state detector 41 calculates, as the first internal-resistance correcting variable, an integral of the instantaneous values of the charging current to the battery 30 and the instantaneous values of the discharging current therefrom within a preset period of time.

In step S233, the state detector 41 also calculates, as the second integral-resistance variable, a polarized state parameter based on, for example, the vehicle information 51.

In the embodiment, the polarized state parameter is the amount of the polarized state of the battery 30. The amount of polarized state of the battery 30 is defined by the following equation:

$$Pn = Pn-1 + x \cdot In \cdot \Delta t - Pn-1 \cdot \Delta t / \tau$$

where Pn represents a present value of the amount of the polarized state of the battery 30, Pn−1 represents a previous value of the amount of the polarized state of the battery 30, In represents a preset value of the current of the battery 30, Δt represents the sampling period for sampling the current of the battery 30, τ represents a preset diffusion time constant of an electrolyte in the battery 30, and x represents the ratio, in all charges flowing to electrodes, of charges remaining as polarized charges.

Thus, the term "x·In·Δt" represents the volume of increase in the amount of the polarized state of the battery 30 caused from the sampling timing of the previous value Pn−1 to the sampling liming of the present value Pn. The term "Pn−1·Δt/τ" represents the volume of attenuation in the amount of the polarized state of the battery 30 from the sampling timing of the previous value Pn−1 to the sampling timing of the present value Pn.

The meaning of the equation will be described hereinafter.

The present value Pn of the amount of the polarized state of the battery 30 is calculated by:

adding, to the previous value Pn−1 of the amount of the polarized state of the battery 30, the volume "x·In·Δt" of increase in the amount of the polarized state of the battery 30; and subtracting, from the sum (Pn−1+x·In·Δt), the volume Pn−1·Δt/τ of attenuation in the amount of the polarized state of the battery 30.

In step S233, the state detector 41 further calculates, as the third integral-resistance correcting variable, the SOC of the battery 30 based on, for example, the vehicle information 51 and the first integral-resistance correcting variable.

In step S234, the state detector 41 corrects the internal resistance Rd calculated in step S9 based on the vehicle information 51 and the first to third internal-resistance correcting variables, to thereby obtaining a corrected internal resistance Rd'.

For example, in step S234, the state detector 41 stores therein at least one map designed as, for example, a data table or a program. The at least one map represents a function (relationship) between a variable of the internal resistance Rd, a variable of the integral of the charging and discharging currents from/to the battery 30, a variable of the polarized state parameter, and a variable of the SOC.

According to the at least on map, the state detector 41 corrects the internal resistance Rd such that the corrected internal resistance Rd' meets the value of each of the first to third internal-resistance correcting variables on the map. This correction allows the corrected internal resistance Rd' to suit the environments associated with the motor vehicle and/or those associated with the battery 30.

In step S234, the state detector 41 multiplies the start current ΔIs calculated in step S10 by the corrected internal resistance Rd' to thereby estimate the voltage drop ΔVdrp across the battery 30 suitable for the restart of the engine 10 at this time.

Next, in step S235, the state detector 41 calculates a value of the minimum voltage Vbtm based on an actual value of the battery voltage Vr and the estimated voltage drop ΔVdrp, and compares the value of the minimum voltage Vbtm with the preset threshold value set slightly greater than the lower limit voltage Vth (see FIG. 2). The state detector 41 determines whether to maintain the engine 10 to be stopped according to the result of the comparison in step S235.

For example, when the value of the minimum voltage Vbtm does not reach the preset threshold value, the state detector 41 determines to maintain the engine 10 to be stopped (YES in step S235), exiting the operation in step S23 and returning to step S24.

Otherwise, when the value of the minimum voltage Vbtm reaches the preset threshold value (NO in step S234), the state detector 41 outputs the engine restart instruction to the starter 12 so as to restart the engine 10 in step S236, returning to step S24.

The loop task in steps S231 to S235 is repeated until the affirmative determination is carried out in step S24 so that a plurality of values of the minimum voltage Vbtm are calculated at different timings based on values of the battery voltage Vr at the different timings and estimated voltage drops ΔVdrp thereat (see step S234). Thus, it is determined whether to maintain the engine 10 to be stopped according to the calculated values of the minimum voltage Vbtm and the lower limit voltage Vth (see FIG. 2).

As described above, the state detector 41 includes the detecting unit (step S2) and the internal resistance calculating unit (steps S3 to S9).

The detecting unit (step S2) samples current and voltage values of the battery 30 within each of a plurality of specified periods contained in the cranking period.

The internal resistance calculating unit (steps S3 to S9) calculates a variation in the sampled current values within each of the plurality of specified periods, and determines whether the variation in the sampled current values within each of the plurality of specified periods is equal to or greater than the predetermined threshold value.

This determination means to determine whether the rate of change in the current of the battery 30 within each of the plurality of specified periods is equal to or higher than the preset threshold value.

This determination eliminates some of pairs of sampled current and voltage values, each pair of which is within one specified period; the rate of change in the current within the one specified period is less than the preset threshold value. Some of pairs of sampled current and voltage values within the one specified period, which vary with variation in the polarized state of the battery 30, with torque variation in the engine 10, or with the increase in the rotational speed of the engine 10, may cause an error in calculating the internal resistance Rd.

Thus, in comparison to conventional state detectors, it is possible to calculate, at high accuracy, the internal resistance Rd of the battery 30 having a little of error.

The internal resistance calculating unit (steps S3 to S9) determines whether a variation in the sampled current values within each of the plurality of specified periods is equal to or greater than the predetermined threshold value. In contrast, a conventional apparatus is designed to calculate a linear regression Lb based on a scatter graph of current-voltage characteristics illustrated in FIG. 6, and calculates, based on the inclination of the linear regression Lb, the internal resistance.

However, as described above, the scatter graph of the current-voltage characteristics illustrated in FIG. 6 has a certain level of variance due to: the change in the polarized state of the battery, and the repetitive increase and decrease of the current and voltage in addition to a certain level of variance due to detection error.

In contrast, in the embodiment, the internal resistance calculating unit (steps S3 to S9) determines whether a variation in the sampled current values within each of the plurality of specified periods is equal to or greater than the predetermined threshold value. This configuration eliminates a data group that may cause an error in calculating the internal resistance Rd (see FIG. 8). That is, the internal resistance calculating unit (steps S3 to S9) calculates the internal resistance Rd based on the current and voltage values of the battery 30 that are sampled when the change in the polarized state of the battery 30 is small. Thus, it is possible to reduce an error contained in the internal resistance Rd of the battery 30.

The internal resistance calculating unit (steps S3 to S9) sets the threshold value to be compared with a variation in the sampled current values of the battery 30 such that the adverse effects of the variation in the polarized state of the battery 30 within each of the specified periods are reduced. Thus, even if the polarized state varies within one specified period, the ratio of the polarization resistance components that vary with the polarized-state variation to the internal resistance Rd is sufficiently reduced.

That is, it is possible to approximate the internal resistance Rd to the state-resistance components that vary according to the state of the battery 30. This reduces an error to be included in the internal combustion engine Rd, making it possible to more reliably restrict the adversely effects of the polarization and to calculate the internal resistance Rd with high accuracy.

In addition, the internal resistance calculating unit (steps S3 to S9) derives a linear approximation function from the current and voltage values included in at least one specified period within which the variation in the sampled current values is equal to or greater than the predetermined threshold value (see step S5).

Because the at least one specified period is longer than a sampling period at each of which a value of the current and a corresponding value of the voltage of the battery 30 is sampled, the at least one specified period includes a plurality of sets of values of the current and voltage of the battery 30. According to the current and voltage values included in the at least one specified period and distributed in a current-voltage plane, the internal resistance calculating unit (steps S3 to S9) derives, from the current and voltage values included in the at least one specified period, the linear approximation function, In this modification, the inclination of the first approximation function corresponds to the internal resistance Rd. Thus, the derivation of the linear approximation function calculates the internal resistance Rd with higher accuracy.

The internal resistance calculating unit (steps S3 to S9) sets a plurality of coefficients for a plurality of specified periods, respectively; these coefficients are arranged to be in ascending order from the start of the cranking period toward the last thereof (see step S8). When setting the sum of the plurality of coefficients to 1, the internal resistance calculating unit (steps S3 to S9) averages a plurality of local internal resistance values corresponding to the plurality of specified periods. The plurality of local internal resistance values are changed depending on the charging state, the temperature change, and/or the polarized state of the battery 30.

For this reason, one local internal resistance value calculated by the current and voltage values that are more recently sampled has a high reliability. It is preferable to consider temporal elements for the cranking period. Thus, it is possible to calculate the internal resistance Rd with higher accuracy, thus more precisely detecting the state of the battery 30.

The state detector 41 includes a start current calculator (step S10), a voltage drop calculator (step S234), and a determiner (step S235). In the embodiment, the battery 30 is a battery installed in the motor vehicle. The state detector 41 for the battery 30 is configured to detect the state of the battery 30 based on the internal resistance Rd calculated by the internal resistance calculating unit (steps S3 to S9). This configuration allows the ECU 40 for example to control the engine 10 and the target voltage based on the state of the battery 30. Thus, it is possible to stably supply power to the ECU 40 and prevent the battery 30 from being excessively discharged.

The starting current calculator (step S10) is configured to calculate the starting current ΔIs for the engine 10 based on the change in the battery voltage during the cranking period and the high-accurately calculated internal resistance Rd. In comparison to the conventional apparatuses, this configuration more precisely calculate the starting current ΔIs required to crank the crankshaft 11 at a preset idle speed. Thus, the voltage drop calculator (step S234) more precisely estimates, based on the starting current ΔIs and the internal resistance Rd, the voltage drop ΔVdrp across the battery 30 in the restart of the engine 10.

In addition, the determiner (step S235) calculates, based on a detected actual value of the battery voltage and the estimated voltage drop ΔVdrp, a value of the minimum voltage Vbtm when the engine 10 is restarted at this time. The determiner (step S235) compares the value of the minimum voltage Vbtm with the lower limit voltage Vth of the battery 30 to thereby determine whether to maintain the engine 10 to be stopped. This configuration more precisely carries out the idling reduction control, thus improving fuel economy of the motor vehicle.

In the embodiment, in step S8, the state detector 41 sets a plurality of coefficients for the plurality of specified periods, respectively; these coefficients are arranged to be in ascending order from the start of the cranking period toward the last thereof. In contrast, the state detector 41 can set a plurality of coefficients for the plurality of specified periods, respectively; each of the plurality of coefficients has a value corresponding to the values of the parameter within a corresponding one of the plurality of specified periods.

For example, the state detector 41 can set a plurality of coefficients for the plurality of specified periods, respectively; each of the plurality of coefficients has a value corresponding to a variation in the sampled current values within a corresponding one of the plurality of specified periods. In this configuration, the greater the variation in the sampled current values is, the more an error contained in the internal resistance Rd is reduced. Thus, it is possible to more accurately calculate the internal resistance Rd, thus more precisely detecting the state of the battery 30.

The plurality of coefficients can be ser for the plurality of specified periods, respectively such that each of the plurality of coefficients is determined according to:

the relationship between the cranking period and a corresponding one of the plurality of specified periods; and the detection values within the corresponding one of the plurality of specified periods.

This modification more precisely detects the state of the battery 30.

In step S4, the state detector 41 compares a variation in the sampled current values of the battery 30 within the specified period with a predetermined threshold value stored in the storage device 42. According to the result of the comparison, the state detector 41 determines whether to calculate the internal resistance based on a data group contained in the specified period.

In contrast, the internal resistance calculating unit can be configured to, when there are variations in the sampled current values (detection values) of the battery 30 within one specified period and the variations are greater than the threshold value, calculate the internal resistance Rd based on:

a number of sets of the sampled current and voltage values of the battery 30 within the one specified period, the number of sets of the sampled current and voltage values of the battery 30 corresponding to some of the variations, respectively, some of the variations being ordered according to their degrees of change and including the largest variation in the variations.

For example, the internal resistance calculating unit (steps S3 to S9) can be configured to calculate the internal resistance Rd based on the sampled current and voltage values of the battery 30 corresponding to the largest variation in the number of variations. This selects a data set of the sampled current and voltage values of the battery 30 that is sampled during the cranking period when the variation in the polarized state of the battery 30 per unit of time is small. Thus, it is possible to reduce, on the calculated internal resistance Rd, the adverse effects of the variation in the polarized state of the battery 30, thus more precisely calculating the internal resistance.

In addition, each of a plurality of specified periods within which some of the sampled current and voltage values of the battery 30 are contained can be adjusted to be extended or reduced. The threshold value to be compared with a variation in the detection values and the length of each of the plurality of specified periods can be determined in consideration of the structure of the battery 30 and the sampling period of each of the various sensors. This reduces an error due to the adversely effects of the polarization of the battery 30 included in the calculated internal resistance Rd, thus detecting the state of the battery 30 with high accuracy based on the calculated internal resistance.

The detecting unit (step S2) uses, as the values of the parameter, the sampled current values of the battery 30, but it can use, as the values of the parameter, the sampled battery voltages and/or power values based on the sampled current and voltage values of the battery 30. In this configuration, the internal resistance calculating unit can set a proper threshold value, compare a variation in the values of the parameter with the proper threshold value, and calculate the internal resistance Rd based on the sampled current and voltage values within preset period; these sampled current and voltage values have a little variance.

The battery 30 is installable in vehicles, but the present invention can be applied to alternative batteries that serve as a power source for starting an internal combustion engine.

While there has been described what is at present considered to be the embodiment and its modifications of the present invention, it will be understood that various modifications which are not described yet may be made therein, and it is intended to cover in the appended claims all such modifications as fall within the scope of the invention.

What is claimed is:

1. An apparatus for detecting a state of a battery serving as a power source for cranking an internal combustion engine, the apparatus comprising:
    a detecting unit configured to detect a current and a voltage of the battery during a cranking period of the internal combustion engine, and output a parameter associated with at least one of the detected current and voltage of the battery; and
    an internal resistance calculating unit configured to, when a degree of change in the parameter within each of a plurality of specified periods included in the cranking period is equal to or greater than a predetermined threshold:
        (i) calculate a local internal resistance of the battery based on first values of the current and voltage for a corresponding one of the plurality of specified periods, the first values of the current and the voltage being detected within each of the plurality of specified periods, the local internal resistance being in plurality for the plurality of specified periods, respectively;
        (ii) set a plurality of coefficients for the plurality of specified periods, the plurality of coefficients being arranged to be in ascending order from a start of the cranking period to a last thereof; and
        (iii) multiply each of the plurality of the local internal resistances of the battery by a corresponding one of the plurality of coefficients, and thereafter average the plurality of local internal resistances of the battery so as to calculate the internal resistance of the battery.

2. The apparatus according to claim 1, wherein the degree of change in the parameter is a variation in values of the parameter within the specified period.

3. The apparatus according to claim 2, wherein the variation is in plurality within the specified period, the variations in the values of the parameter are greater than the predetermined threshold, and the internal resistance calculating unit is configured to calculate the internal resistance based on:
    a number of sets of the values of the parameter within the specified period, the number of sets of the values of the parameter corresponding to some of the variations, respectively, some of the variations including a largest one in the variations and being ordered according to their degrees of change.

4. The apparatus according to claim 1, wherein the degree of change in the parameter is a rate of change in values of the parameter within the specified period.

5. The apparatus according to claim 1, wherein
    each of the plurality of coefficients is determined according to the first values of the current and the voltage detected within a corresponding one of the plurality of specified periods.

6. The apparatus according to claim 1, wherein the internal resistance calculating unit is configured to derive, from the values of the current and the voltage being detected within the specified period, a linear approximation function, and to calculate the internal resistance of the battery according to the linear approximation function.

7. The apparatus according to claim 1, wherein the parameter associated with at least one of the detected current and voltage of the battery is the current of the battery.

8. The apparatus according to claim 1, wherein the predetermined threshold is determined in consideration of an effect of a variation in a polarized state of the battery within the specified period.

9. The apparatus according to claim 8, wherein the internal resistance includes a polarization resistance component and a state-resistance component, the polarization resistance component varying with variation in the polarized state of the battery, the state-resistance component varying with variation in the state of the battery and being composed of a resistance component except for the polarization resistance component, and the predetermined threshold is determined to reduce a ratio of the polarization resistance component to the internal resistance within the specified period so that the internal resistance is allowed to be approximated to the state-resistance component to thereby restrict the effect of the variation in the polarized state of the battery within the specified period.

10. The apparatus according to claim 1, wherein the battery is a battery installed in a motor vehicle including the internal combustion engine.

11. The apparatus according to claim 10, further comprising:
    a starting current calculator configured to calculate a starting current used to crank the internal combustion engine that has been stopped according to an amount of change in the voltage of the battery in the cranking period and the internal resistance;
    a voltage drop estimator configured to estimate, based on the starting current and the internal resistance, a voltage drop across the battery due to the cranking of the internal combustion engine; and
    a determiner configured to determine, based on an actual value of the voltage of the battery and the estimated voltage drop, whether to maintain the internal combustion engine to be stopped.

12. An idling reduction control system installed in a motor vehicle, the motor vehicle comprising an internal combustion engine and a starter for cranking the internal combustion engine, the idling reduction control system comprising:
    an engine stop unit configured to automatically stop the internal combustion engine when at least one engine automatic stop condition is met;

a battery serving as a power source for cranking the internal combustion engine;

an apparatus for detecting a state of the battery, the apparatus comprising:

a detecting unit configured to detect a current and a voltage of the battery during a cranking period of the internal combustion engine, and output a parameter associated with at least one of the detected current and voltage of the battery; and an internal resistance calculating unit configured to, when a degree of change in the parameter within a specified period included in the cranking period is equal to or greater than a predetermined threshold, calculate an internal resistance of the battery based on values of the current and voltage of the battery, the values of the current and the voltage being detected within the specified period;

a starting current calculator configured to calculate a starting current used to crank the internal combustion engine that has been stopped by the engine stop unit according to an amount of change in the voltage of the battery in the cranking period and the internal resistance;

a voltage drop estimator configured to estimate, based on the starting current and the internal resistance, a voltage drop across the battery due to the cranking of the internal combustion engine;

a determiner configured to determine, based on an actual value of the voltage of the battery and the estimated voltage drop, whether to maintain the internal combustion engine to be stopped; and an engine restarting unit configured to, when it is determined not to maintain the internal combustion engine to be stopped, supply the starting current to the starter so that the starter cranks the internal combustion engine.

* * * * *